(12) United States Patent
Dietrich

(10) Patent No.: US 10,171,106 B2
(45) Date of Patent: Jan. 1, 2019

(54) SYSTEMS AND METHODS FOR MULTI-STAGE DATA SERIALIZATION IN A MEMORY SYSTEM

(71) Applicant: MICRON TECHNOLOGY, INC., Boise, ID (US)

(72) Inventor: Stefan Dietrich, Türkenfeld (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/606,194

(22) Filed: May 26, 2017

(65) Prior Publication Data

US 2018/0343015 A1  Nov. 29, 2018

(51) Int. Cl.
*H03M 9/00* (2006.01)
*H03K 5/135* (2006.01)
*G06F 13/16* (2006.01)
*G06F 13/38* (2006.01)

(52) U.S. Cl.
CPC .......... *H03M 9/00* (2013.01); *G06F 13/1678* (2013.01); *G06F 13/385* (2013.01); *H03K 5/135* (2013.01); *G11C 2207/107* (2013.01)

(58) Field of Classification Search
USPC ................................................ 710/71, 61–64
See application file for complete search history.

(56) References Cited

U.S. PATENT DOCUMENTS

| 6,985,096 | B1* | 1/2006 | Sasaki | H03K 5/135 |
| | | | | 341/100 |
| 7,190,754 | B1* | 3/2007 | Chang | H03L 7/07 |
| | | | | 375/371 |
| 8,760,328 | B1* | 6/2014 | Koay | H03M 9/00 |
| | | | | 341/100 |
| 2006/0291323 | A1* | 12/2006 | Freebern | G11C 7/1012 |
| | | | | 365/233.1 |
| 2018/0083768 | A1* | 3/2018 | Chattopadhyay | H04L 7/06 |

\* cited by examiner

*Primary Examiner* — Raymond N Phan
(74) *Attorney, Agent, or Firm* — Fletcher Yoder P.C.

(57) ABSTRACT

An integrated circuit includes first and second double data rate (DDR) shift registers. A multiplexor outputs a serialized data burst by selecting between a first output stream of the first DDR shift register and a second output stream of the second DDR shift register based upon a received selector signal. The selector signal is derived from clock doubling circuitry that provides a frequency that is twice a frequency of a first clock driving the first DDR shift register.

17 Claims, 6 Drawing Sheets

SYSTEMS AND METHODS FOR MULTI-STAGE DATA SERIALIZATION IN A MEMORY SYSTEM

BACKGROUND

Field of Invention

Embodiments of the invention relate generally to the field of computer memory systems. More specifically, embodiments of the present invention include one or more systems, devices, and methods for efficiently serializing parallel data.

Description of Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices often include memory storage devices that store electronic data. As the electronic devices become more sophisticated, input and output (IO) data rate requirements may increase significantly. Unfortunately, traditional serialization techniques may not meet the needs of these increased data rate requirements. Certain specifications (e.g., specifications of the Joint Electron Device Engineering Council (JEDEC) may provide increasing IO data rate requirements. For example, the GDDR5x specification sets the IO data rate requirement at more than 10 Gigabits per second (Gbps). Accordingly, one data eye (UI) is smaller than 100 picoseconds (ps). The serializer, which converts parallel data to a burst stream of serial data, is a speed-critical component affecting this IO data rate. Accordingly, embodiments of the present invention may be directed to enhancement of the serialization process, resulting in support for higher IO data rates.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As input and output (IO) data rate requirements continue to increase for new memory specifications (e.g. specifications of the Joint Electron Device Engineering Council (JEDEC), new mechanisms for increasing data processing on critical timing paths may be desirable. For example, the serializer, which converts parallel data to a burst stream of serial data, is a speed-critical component affecting IO data rate between memory devices and their controllers. Accordingly, embodiments disclosed herein relate to enhancement of the serialization process, resulting in support for higher IO data rates.

Figure 1:
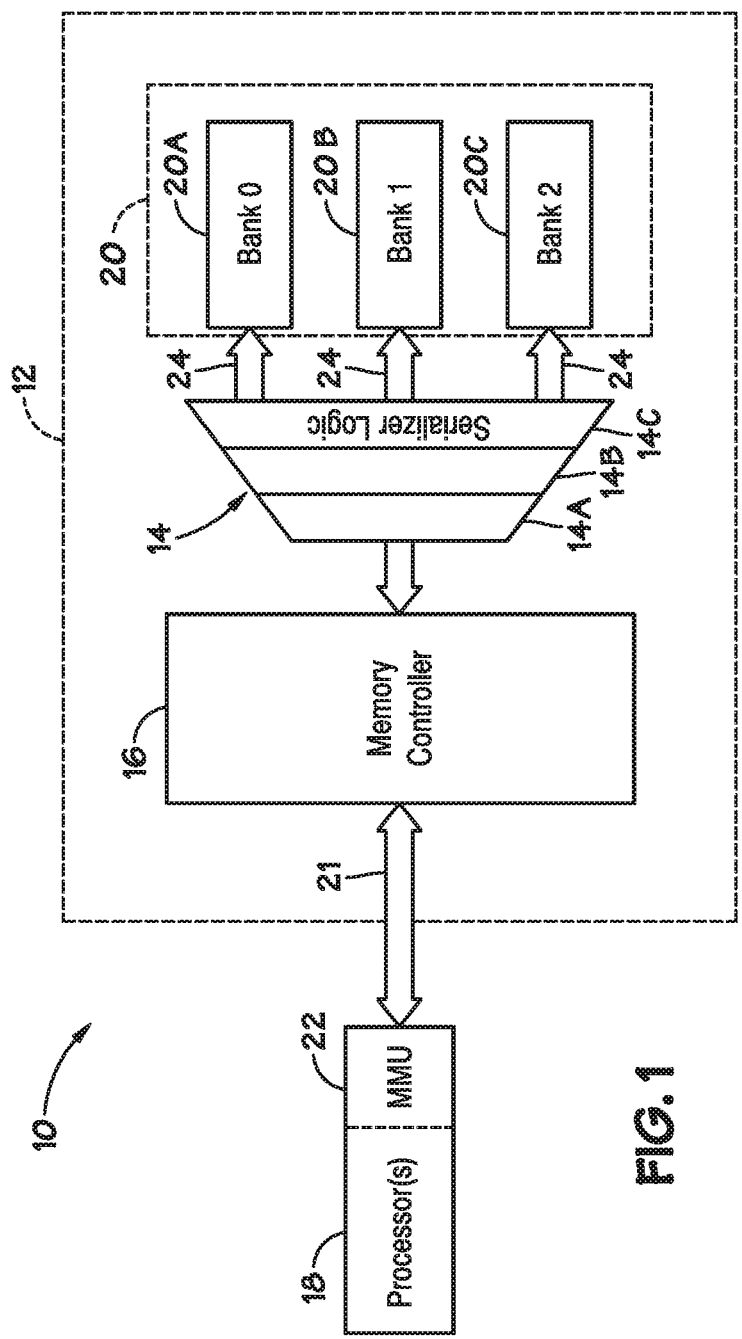
FIG. 1 is a block diagram, illustrating a memory management system, in accordance with an embodiment.

FIG. 1 is a block diagram illustrating an electronic device 10 that utilizes a memory management system 12 that converts parallel data into serialized burst streams via multi-stage serializer circuitry/logic 14, in accordance with an embodiment. As shown in FIG. 1, the processor(s) 18 may communicate with the memory array 20 (e.g., memory banks 20A, 20B, and/or 20C) via the memory controller 16 and a bus 21. In general, an operating system (OS) running on the processor(s) 18 may allocate and deallocate memory at logical addresses. In some embodiments, a memory management unit (MMU) 22 of the processor(s) 18 may translate the logical addresses employed by the OS into physical addresses that generally correspond to memory addresses understood by the memory controller 16. The MMU 22 may perform this translation using one or more translation look aside buffers (TLB) or any other suitable hardware. In some other embodiments, the OS of the processor(s) 18 may translate the logical addresses to the physical addresses. The memory controller 16 may receive instructions to read data from or write data to one of the physical address from the processor(s) 18.

Contiguous physical addresses requested by the processor(s) 18 may not directly correspond to contiguous actual memory addresses located on memory banks 20A, 20B, and 20C, shown in FIG. 1 as BANK 0, BANK 1, and BANK 2. Rather, the memory controller 16 may map the physical addresses requested by the processor(s) 18 to actual memory addresses, also referred to herein as "dual in-line memory module (DIMM) addresses," that may be distributed approximately evenly across all of the memory banks 20A, 20B, and 20C. The memory banks 20A, 20B, and 20C may include any suitable memory devices, such as double data rate three synchronous dynamic random access memory (DDR3 SDRAM), double data rate four synchronous dynamic random access memory (DDR4 SDRAM), double data rate five synchronous dynamic random access memory (DDR5 SDRAM), graphics double data rate five synchronous dynamic random access memory (GDDR5 SDRAM), graphics double data rate five x synchronous dynamic random access memory (GDDR5x SDRAM) and/or graphics double data rate six synchronous dynamic random access memory (GDDR6 SDRAM). The memory controller 16 may communicate with the three memory banks 20A, 20B, and 20C via a memory bus 23 coupled between the memory controller 16 and a multi-stage serializer circuitry/logic 14 and high-speed memory busses 24, which may respectively interconnect the serializer circuitry/logic 14 with the three memory banks 20A, 20B, and 20C. In alternative embodiments, the memory management system 12 may include more or fewer memory buses and memory banks in the memory array 20.

As will be discussed in more detail below, the serialization logic 14 may enable an increased IO data rate (e.g., to above 10 Gbps), by completing the serialization using multiple stages (e.g., three stages 14A, 14B, and 14C). This increased IO data rate may result in faster memory operations, which may be a specification of certain standards, such as the JEDEC GDDR5x and/or GDDR6 standards.

Figure 2:
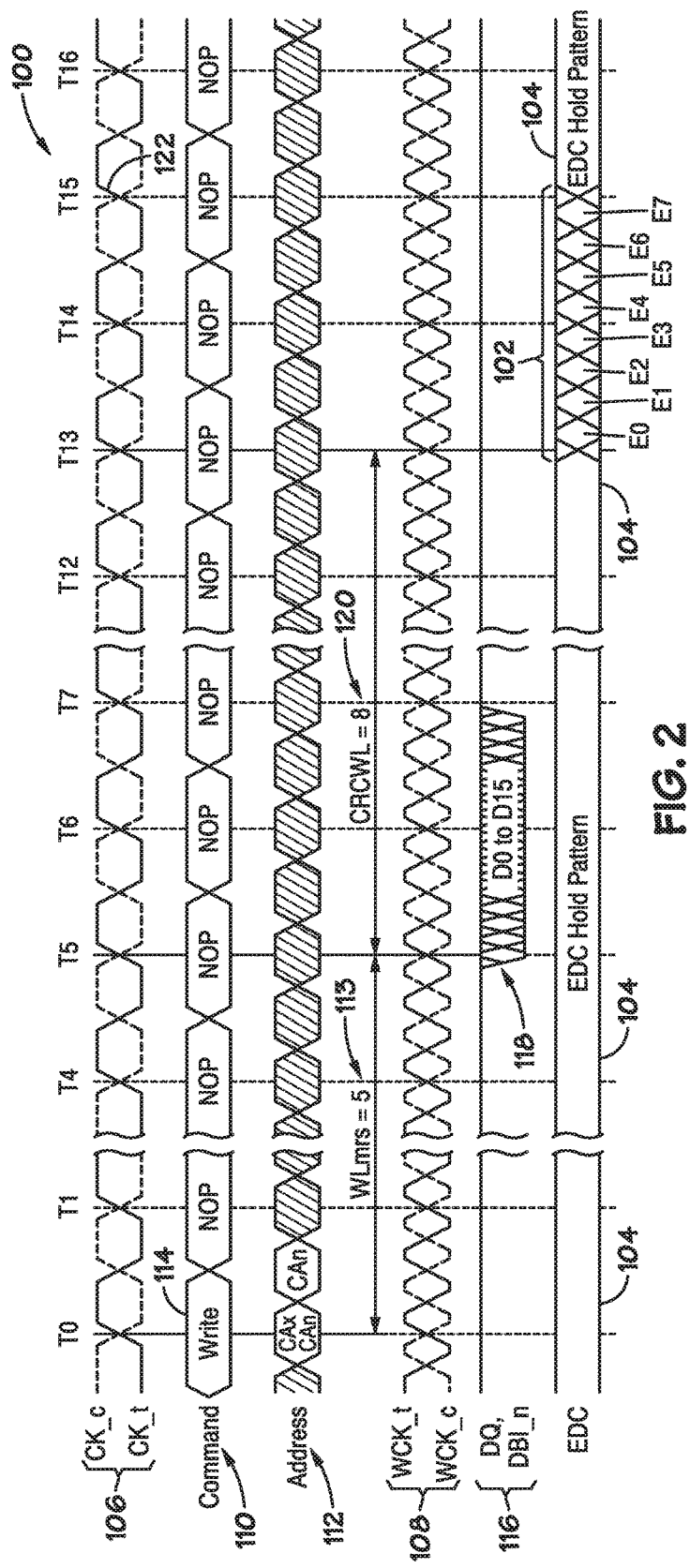
FIG. 2 is a timing diagram, illustrating provision of a serialized data burst, in accordance with an embodiment of the present disclosure.

Turning to an overview of memory control via signal timing, FIG. 2 is a timing diagram 100, illustrating provision of a serialized data burst, in accordance with an embodiment of the present disclosure. Clock CK inputs 106 are differential system clock inputs (e.g., CK_c and CK_t). Clock WCK inputs 108 are a second set of differential data clock inputs (e.g., WCK_c and WCK_t). As illustrated, the frequency of the WCK inputs 108 may be twice that of the frequency of the CK inputs 106. Commands 110 may be registered at every rising edge of CK_t, while addresses 112 may registered at every rising edge of CK_t and every rising edge of CK_c.

The WRITE latency (WLmrs) 113 is the delay in clock cycles used in the calculation of the total WRITE latency (WL) between the registration of the WRITE command 114 and the availability of a first piece of input data. In the current embodiment, the WLmrs is set to five cycles, but could vary in other embodiments (e.g., based upon DRAM vendor specifications, etc.). The DQ/DBI timing 116 illustrates when a serialized data burst 118 is written after the WLmrs 113.

The CRC Read Latency 120 (CRCRL) provides an indication of a delay in clock cycles to lapse prior to reading cyclic redundancy check (CRC) data. In the depicted embodiment, the CRCRL 120 is set to eight cycles, but could vary in other embodiments (e.g., based upon DRAM vendor specifications, etc.). As illustrated, the EDC data 102 is provided at T13, after the CRCRL 120 is complete.

Once the EDC data 102 is provided, the EDC hold pattern 104 is once again provided. As illustrated at time T15, a proper starting time for the EDC hold pattern 104 is synchronous to a rising edge (e.g., rising edge 122) of CK_t. The provision of the EDC hold pattern may be facilitated by programming a mode register with a four bit pattern. These four bits are transmitted during a CK_t cycle. The EDC hold pattern 104 may be repeated, such that the EDC hold pattern 104 is provided before and after providing any CRC data 102, as illustrated in FIG. 2.

The EDC hold pattern 104 is transmitted by data path circuitry/logic of the electronic device (e.g., electronic device 10 of FIG. 1). The data path circuitry/logic may be synchronized to the WCK_t clock. As discussed above, the frequency of the WCK_t clock may vary from the frequency of the CK_t clock. For example, the frequency of the WCK_t clock may be twice the frequency of the CK_t clock, as illustrated in FIG. 2. Thus, the four bits of the EDC hold pattern 104 may be transmitted with two rising and two falling edges of the WCK_t clock, within one cycle of the CK_t clock.

Figure 3:
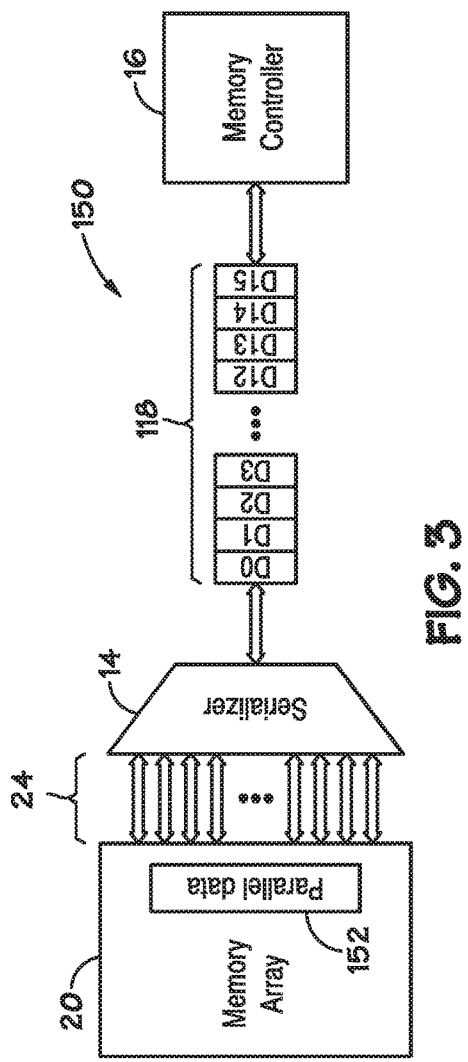
FIG. 3 is a block diagram, illustrating parallel data converted to a serial burst of data, in accordance with an embodiment of the present disclosure.

As mentioned above, provision of the serialized data burst 118 may be facilitated by the memory management system 12 of FIG. 1. For example, the serializer logic 14 of FIG. 1 may serialize the serialized data burst 118 from parallel data that it receives from the memory 20. FIG. 3 is a block diagram 150, illustrating parallel data 152 converted to a serial burst of data 118, in accordance with an embodiment of the present disclosure. As illustrated, the memory array 20 may provide parallel data 152, via a set of high-speed busses 24, to the serializer circuitry/logic 14, which converts the parallel data 152 into a burst stream of serial data 118. For example, in some embodiments, the parallel data may include 16-bit-wide parallel data (per DQ pin) that is converted into a burst stream of 16-bit serial data. The burst stream of serial data 118 is provided to memory controller for completion of the memory operation.

Figure 4:
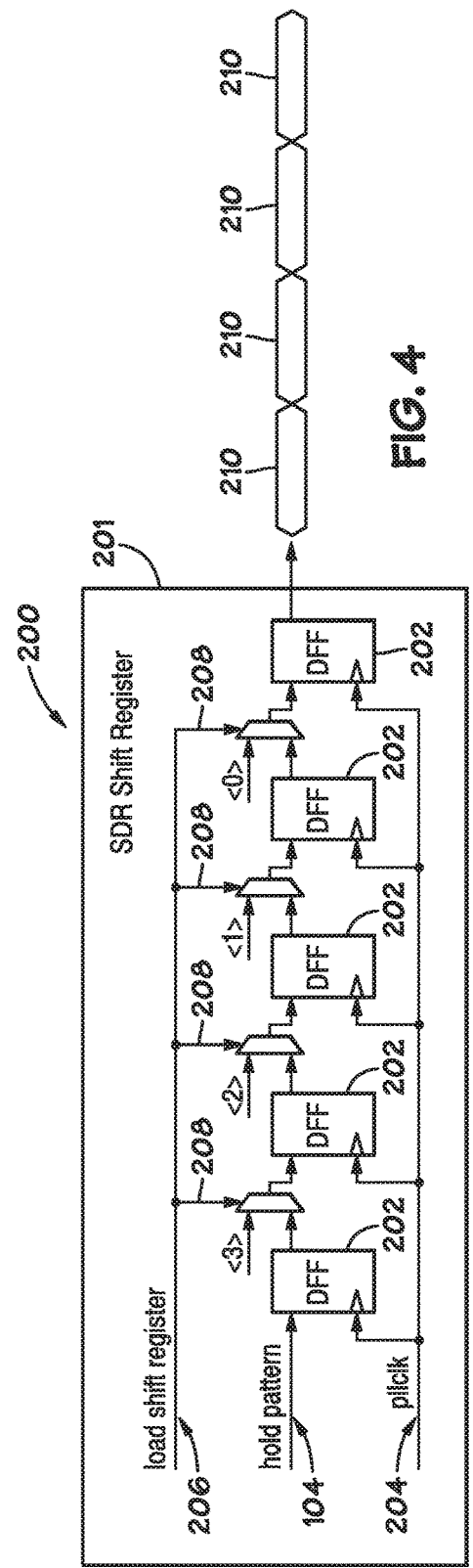
FIG. 4 is a block diagram, illustrating a single data rate (SDR) serializer stage, in accordance with an embodiment.

As discussed above, to enhance the serialization process, the serializer circuitry/logic 14 may include multiple stages (e.g., 14A-C in FIG. 1). FIG. 4 is a block diagram, illustrating a first stage 14A of the serializer circuitry/logic 14, known as single data rate (SDR) serializer stage 200, in accordance with an embodiment. The SDR serializer stage 200, may include an SDR shift register 201 with a set of data flip flops (DFF) 202 that are clocked by a phase locked loop (PLL) clock signal 204 (pllclk) that is derived from the WCK_t clock discussed in FIG. 2. While the pllclk clock signal 204 is derived from the WCK_t clock, the pllclk may have a common frequency with the CK_t clock discussed in FIG. 2. As illustrated, the SDR serializer stage 200 may receive the EDC hold pattern 104. The load shift register signal 206 is a pulse that opens multiplexors 208, enabling parallel loading of the SDR shift register 201 (e.g., at the data flip flops 202).

Figure 5:
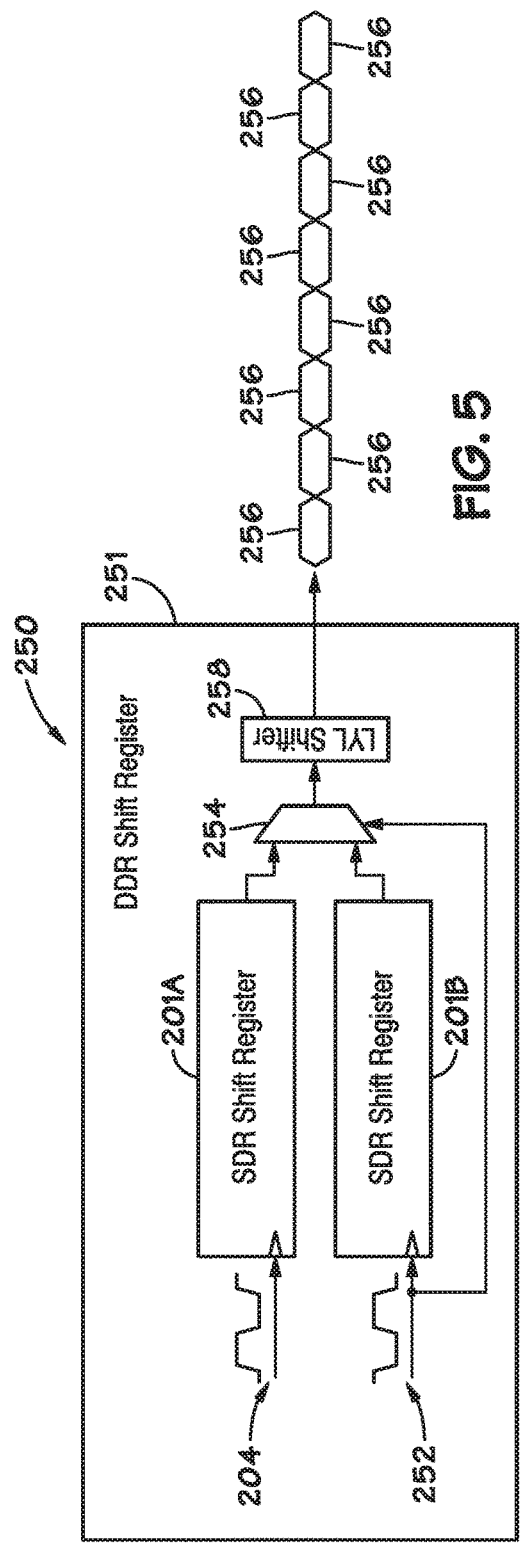
FIG. 5 is a block diagram, illustrating a double data rate (DDR) serializer stage, in accordance with an embodiment.

The data may be shifted out serially, as illustrated by the data eyes 210. The data eyes 210 may be quite long, as the width is dependent on a cycle time of the driving clock (e.g., the pllclk). To counter-act this speed deficiency, a second stage may be added, as discussed above. FIG. 5 is a block diagram, illustrating a second stage 14B of the serializer circuitry/logic 14, known as the double data rate (DDR) serializer stage 250, in accordance with an embodiment.

As illustrated, the double data rate (DDR) serializer stage 250 includes a DDR shift register 251 that includes multiple SDR shift registers 201 (e.g., SDR shift registers 201A and 201B) that run in parallel. To facilitate parallel SDR shift registers 201A and 201B, one of the SDR shift registers 201A is clocked using the pllclk_204, while the second SDR shift register 201B is clocked using a complementary clock signal 252 of the pllclk clock signal 204. A multiplexor 254 receives inputs from the SDR shift registers 201 (e.g., SDR shift registers 201A and 201B) and selects the proper input for output based upon either the pllclk clock signal 204 or the complementary clock signal 252. Accordingly, as illustrated, the length of the data eyes 256 is half that of the data eyes 210 of FIG. 4. Thus, the IO data rate of the DDR shift register 251 is twice the IO data rate of the SDR shift register 201 of FIG. 4.

In some memory standards, certain voltage specifications may be defined. For example, in GDDR5x, an output voltage specification may require a particular output voltage (VDDQ) domain, such as 1.35V. However, signals provided to the DDR shift register 251 may be provided at a different internal voltage domain (VPERI), such as at 1.15V. Accordingly, a level shifter 258 may convert signals from the VPERI domain to the VDDQ domain (e.g., from 1.15V to 1.35V). Though the DDR serializer stage 250 is not the last stage of the multi-stage serializer circuitry/logic 14, it may be particularly beneficial to implement the level shifter 258 in the DDR serializer stage 250, as level shifters that support the IO data rate at the DDR serializer stage 250 may be more readily available, than level shifters that support an IO data rate of the subsequent serializer stage (e.g., double the IO rate of the DDR shift register 251).

Figure 6:
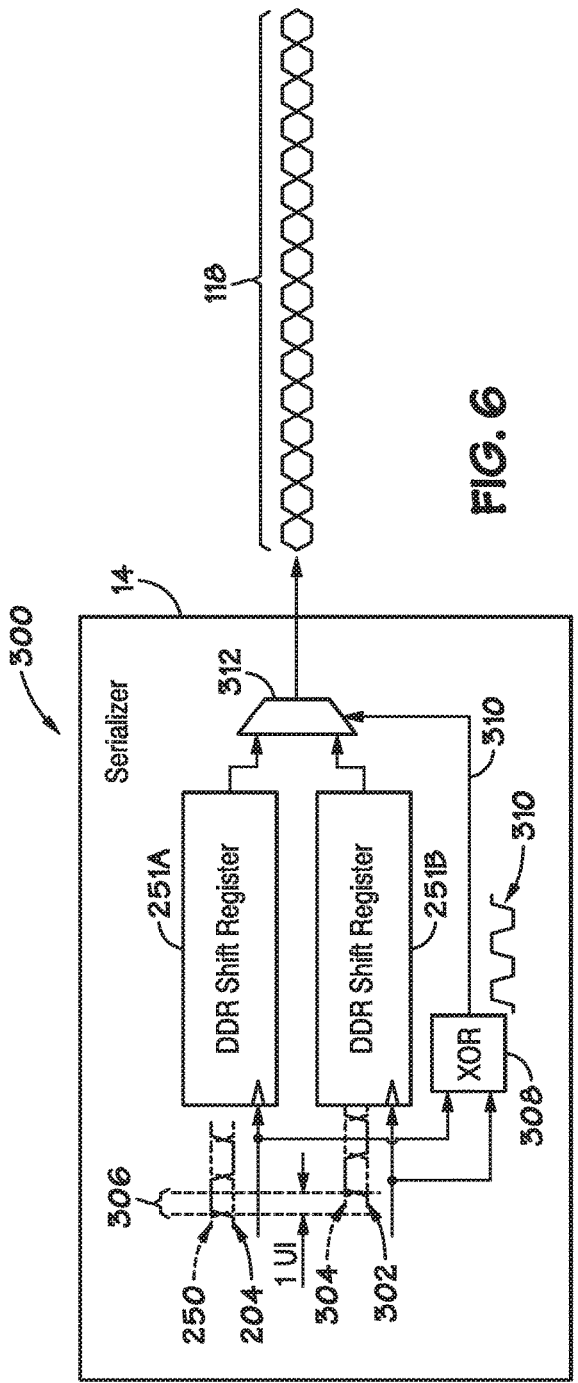
FIG. 6 is a block diagram, illustrating a quad data rate (QDR) serializer stage, in accordance with an embodiment.

The last stage of the multi-stage serializer circuitry/logic 14 may multiplex two DDR shift registers 251. FIG. 6 is a block diagram, illustrating this stage, known as the quad data rate (QDR) serializer stage 300, in accordance with an embodiment. As illustrated, in this stage, the multi-stage serializer circuitry includes two DDR shift registers 231A and 231B. DDR shift register 231A may be clocked using the pllclk clock signal 204 (and its complementary clock signal 250, as discussed above). As illustrated by lines, 306, the second DDR shift register may be clocked using a 90 degree offset clock signal 302 and its complementary clock signal 304 that are shifted one unit interval (UI) (e.g., a 90 degree offset) from the pllclk clock signal 204 and complementary clock signal 250, respectively.

Figure 7:
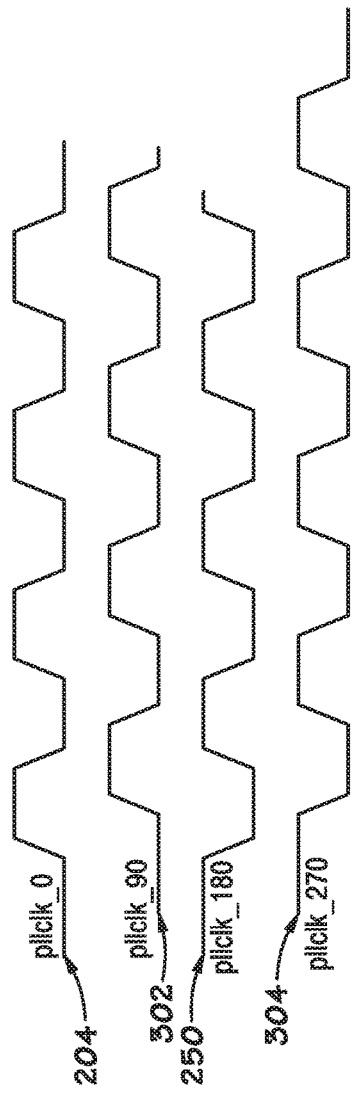
FIG. 7 is a diagram, illustrating phase locked loop (PLL) clock relations between the serializer stages, in accordance with an embodiment.

FIG. 7 is a diagram, illustrating phase locked loop (PLL) clock relations between the serializer stages, in accordance with an embodiment. Clock signal 204 (pllclk_0) and its complementary clock signal 250 (pllclk_180) may drive the DDR shift register 231A. Further, the 90 degree offset clock signal 302 (pllclk_90) and its complementary clock signal 304 (pllclk_270) may drive the second DDR shift register 231B.

As mentioned above, the DDR shift registers' output streams have a phase difference of one UI, as the DDR shift register 231A is triggered by the pllclk_0 clock signal 204 and the pllclk_180 clock signal 250, while DDR shift register 231B is triggered by pllclk_90 clock signal 302 and pllclk_270 clock signal 304. In order to multiplex the streams of the DDR shift registers 231A and 231B, the clock frequency may need to be doubled (e.g., to enable fast multiplexing by the multiplexor 312).

In some embodiments, a global ultra-high speed clock tree for quad data rate (QDR) output may be introduced to provide this fast output. However, globalized ultra-high speed clock trees may be quite sensitive to noise, shifting, etc. Accordingly, in some embodiments, a clock doubling circuit may be implemented locally in the serializer circuitry/logic 14. By implementing the clock doubling circuit locally, the clock doubling circuit may be less sensitive to noise, shifting, etc. In one embodiment, the clock signals 204 and 302 may be provided to XOR logic 308. Because the phase difference between the output streams of the DDR shift registers 231A and 231B are one UI, the output of the XOR logic 308 may be used as a selector signal 310 for the multiplexor 312. Using the XOR logic 308 as the selector signal 310 for the multiplexor 312 that selects between the output streams of the DDR shift registers 231A and 231B, the serialized data burst 118 may be outputted from the serializer circuitry/logic 14. For example, in the current embodiment, a 16-bit serialized data burst 118 is provided from the serializer circuitry/logic 14. Further, the multi-stage approach to the serialization may result in a quad data rate (QDR) that exceeds 10 Gbps. Thus, by using the multi-stage serializer circuitry/logic 14, an increased IO data rate may be realized, in accordance with certain IO data standards (e.g., dictated by GDDR5x standards).

Figure 8:
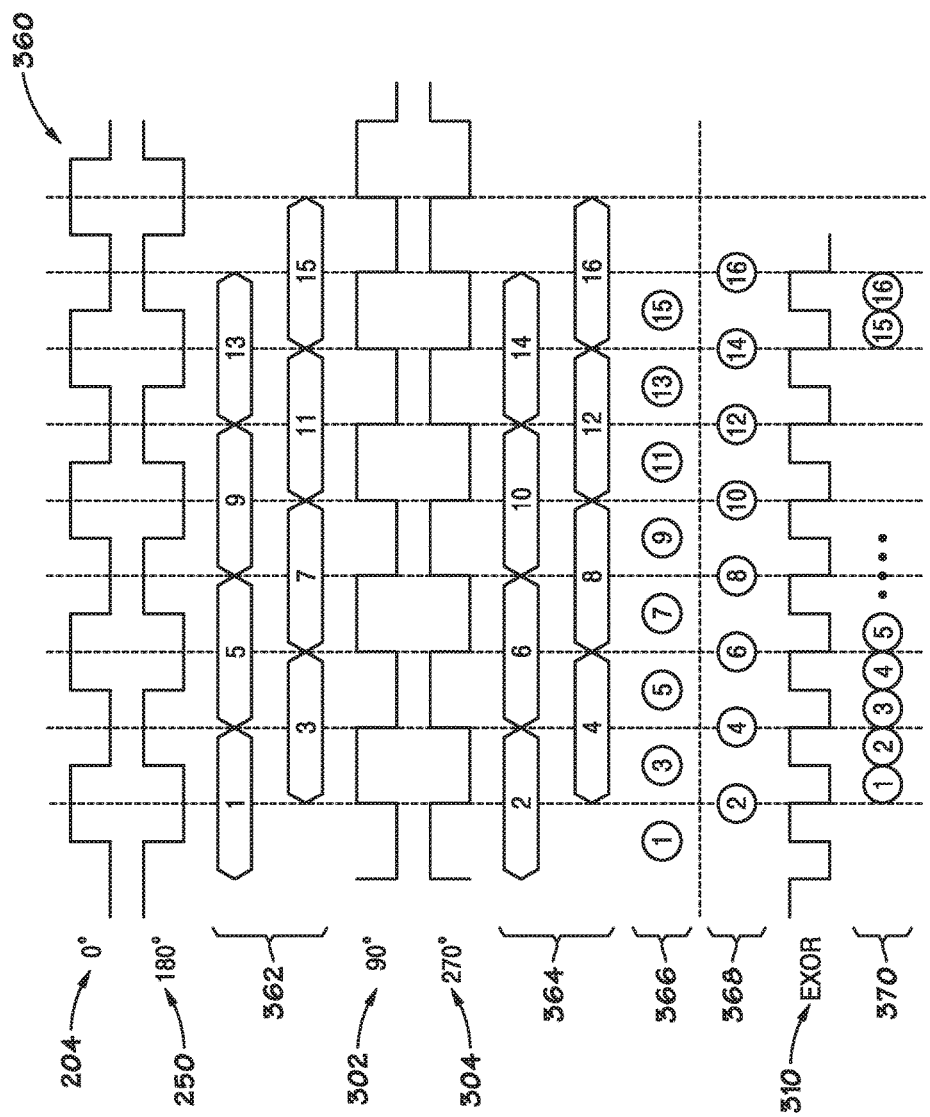
FIG. 8 is a timing diagram, illustrating the PLL clock timings, in accordance with an embodiment.

FIG. 8 is a timing diagram 360 illustrating timings of these clock signals 204, 250, 302, and 304 within the multi-stage serializer circuitry/logic 14, in accordance with an embodiment. As illustrated, the SDR data windows 362 of a first DDR shift register and the SDR data windows 364 of a second DDR shift register each span one clock length. Accordingly, the data windows 366 and 368 for the first and second DDR shift registers each span one-half of a clock cycle. The XOR logic 208 selector signal 310 drives the selection between the first and second DDR shift registers in the multi-stage serializer circuitry/logic 14. Thus, the resulting data windows 370 of the multi-stage serializer circuitry/logic 14 each span one-quarter of a clock cycle. Accordingly, data received in parallel is serialized and output by the multi-stage serializer circuitry/logic 14.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory system, comprising:
a memory device configured to provide a set of data in parallel;
a memory controller configured to coordinate data transmission of a memory device;
multi-stage serializer circuitry configured to receive the set of data in parallel and provide, to the memory controller, the data serially as a serialized data burst;
wherein the multi-stage serializer circuit comprises a set of two or more double data rate (DDR) shift registers; and
wherein each of the two or more DDR shift registers comprises at least two single data rate (SDR) shift registers, wherein each of the at least two SDR shift registers comprises a series of data flip flops configured to load an error data control (EDC) hold pattern in parallel.

2. The memory system of claim 1, wherein the multi-stage serializer circuit comprises a multiplexor that multiplexes output streams of the at least two DDR shift registers.

3. The memory system of claim 1, wherein:
a first one of the set of two or more SDR shift registers is driven by a first clock; and
a second one of the set of two or more SDR shift registers is driven by a complement of the first clock.

4. The memory system of claim 1, wherein each of the two or more DDR shift registers comprises a voltage level shifter configured to voltage shift outputs of the at least two SDR shift registers from an internal voltage domain (VPERI) to an output voltage domain (VDDQ).

5. The memory system of claim 1, wherein the memory device comprises graphics double data rate five x synchronous random-access (GDDR5X) memory.

6. The memory system of claim 1, wherein the memory device comprises graphics double data rate six synchronous random-access (GDDR6) memory.

7. The memory system of claim 1, wherein each of the DDR shift registers comprises a multiplexor that multiplexes output streams of the at least two SDR shift registers.

8. The memory system of claim 7, wherein the multiplexor is configured to receive a phase locked loop (PLL) clock signal or a complementary clock signal of the PLL clock signal as a selector signal that defines which of the output streams of the at least two SDR shift registers is selected.

9. The memory system of claim 2, wherein:
the multi-stage serializer circuit comprises exclusive or (XOR) logic that provides an XOR output based upon inputs comprising a phase locked loop (PLL) clock signal (pllclk_0) and a one unit interval offset clock signal of the pllclk_0 clock signal (pllclk_90); and
the multiplexor is configured to receive the XOR output as a selector signal that defines which of the output streams of the at least two DDR shift registers is selected.

10. The memory system of claim 3, wherein:
a first one of the set of two or more DDR shift registers is driven by the first clock and the complement of the first clock; and
a second one of the set of two or more DDR shift registers is driven by an offset clock that is a 90 degree offset of the first clock and a complement of the offset clock.

11. The memory system of claim 4, wherein the internal voltage domain comprises 1.15V and the output voltage domain comprises 1.35V.

12. An integrated circuit, comprising:
a first double data rate (DDR) shift register;
a second double data rate (DDR) shift register;
a multiplexor configured to output a serialized data burst by selecting between a first output stream of the first DDR shift register and a second output stream of the second DDR shift register based upon a received selector signal, wherein the selector signal is derived from clock doubling circuitry that provides a frequency that is twice a frequency of a first clock driving the first DDR shift register,
wherein the integrated circuit supports an input/output (TO) data rate of greater than 10 Gbps.

13. The integrated circuit of claim 12, wherein:
the first DDR shift register is driven by a phase locked loop (PLL) clock (pllclk_0) and a complementary clock (pllclk_180) of the PLL clock (pllclk_0); and
the second DDR shift register is driven by an offset clock (pllclk_90) that is a 90 degree offset of the phase locked loop (PLL) clock (pllclk_0) and a complementary clock (pllclk_240) of the offset clock (pllclk_90).

14. The integrated circuit of claim 13, wherein the clock doubling circuitry comprises exclusive or (XOR) logic that compares the PLL clock (pllclk_0) and offset clock (pllclk_90) and provides an XOR output as the selector signal.

15. The integrated circuit of claim 12, wherein:
the first DDR shift register comprises a first set of two single data rate (SDR) shift registers; and
the second DDR shift register comprises a second set of two SDR shift registers.

16. A method, comprising:
driving a first double data rate (DDR) shift register of a multi-stage serializer based upon a first clock and a second clock that is a complement of the first clock;
driving a second DDR shift register of the multi-stage serializer based upon a third clock that is an offset of the first clock and a fourth clock that is a complement of the third clock;
multiplexing between a first output stream of the first DDR shift register and a second output stream of the second DDR shift register; and
deriving a selector signal by applying exclusive or (XOR) logic to the first clock and the third clock.

17. The method of claim 16, comprising:
Voltage level shifting the first output stream and the second output stream from 1.15V domain to a 1.35V domain.

* * * * *